US006396319B2

(12) United States Patent
Nakano

(10) Patent No.: US 6,396,319 B2
(45) Date of Patent: May 28, 2002

(54) SEMICONDUCTOR INTEGRATED CIRCUIT WITH QUICK CHARGING/DISCHARGING CIRCUIT

(75) Inventor: Toshiya Nakano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/739,775

(22) Filed: Dec. 20, 2000

(30) Foreign Application Priority Data

Jul. 26, 2000 (JP) ....................................... 2000-225232

(51) Int. Cl.[7] ............................................... H03K 17/22
(52) U.S. Cl. ....................................... 327/143; 327/198
(58) Field of Search ................................ 327/143, 198, 327/327, 482, 405

(56) References Cited

U.S. PATENT DOCUMENTS

| | | | | | |
|---|---|---|---|---|---|
| 3,968,437 | A | * | 7/1976 | Ong | 455/192.3 |
| 5,349,242 | A | * | 9/1994 | Tanaka et al. | 327/482 |
| 5,673,277 | A | * | 9/1997 | Amitai et al. | 371/22.3 |
| 5,832,305 | A | * | 11/1998 | Briggs et al. | 327/405 |
| 6,031,405 | A | * | 2/2000 | Yu | 327/327 |
| 6,084,458 | A | * | 7/2000 | Fu | 327/330 |

FOREIGN PATENT DOCUMENTS

| | | |
|---|---|---|
| JP | 1-280905 | 11/1989 |
| JP | 5-22043 | 1/1993 |
| JP | 6-104660 | 4/1994 |

* cited by examiner

*Primary Examiner*—Terry D. Cunningham
(74) *Attorney, Agent, or Firm*—Oblon, Spivak, McClelland, Maier & Neustadt, P.C.

(57) ABSTRACT

Disclosed is a semiconductor integrated circuit capable of performing a normal operation from immediately after turn-on of power without deteriorating degree of integration. The collector of an NPN bipolar transistor Q1 is connected to a terminal P1 and the emitter of the same is connected to a positive electrode of a reference voltage source 32. The emitter of an NPN bipolar transistor Q2 is connected to the terminal P1 and the collector of the same is connected to the positive pole of the reference voltage source 32. The reference voltage source 32 generates a reference voltage VREF2 from its positive electrode and the negative electrode is connected to the ground. A differentiating circuit constructed by a capacitor C1 and resistors R1 and R2 applies a base potential which makes the NPN bipolar transistors Q1 and Q2 operative in a predetermined period (time determined by the differentiating circuit) immediately after turn-on of power and, after elapse of the predetermined time, applies a base potential at a ground level.

10 Claims, 6 Drawing Sheets

SEMICONDUCTOR INTEGRATED CIRCUIT WITH QUICK CHARGING/DISCHARGING CIRCUIT

BACKGROUND OF THE INVENTION

1. Field of the Invention

The present invention relates to a semiconductor integrated circuit such as a differential amplification circuit.

2. Description of the Background Art

In the case of amplifying signals of various sensors, a differential amplification circuit is often used. Depending on the use, the circuit is requested to operate normal from immediately after power is turned on. When a differential amplification circuit takes the form of a C-coupled application circuit having a large time constant (τ), the request is addressed by, for example, separately adding a quick charging circuit as disclosed in Japanese Unexamined Patent Application No. 6-104660.

FIG. 7 is a circuit diagram showing a conventional differential amplification circuit having a quick charging/discharging circuit. In FIG. 7, a terminal P0 for receiving an input signal from an ac signal source SIG1 is connected to a terminal P1 via a capacitor C2. The terminal P1 is connected to one end of a resistor R24. The other end of the resistor R24 is connected to one of electrodes of a capacitor C3, one end of a resistor R25, and an input of a buffer BF1. The other end of the resistor R25 is connected to one end of a resistor R26 and a positive electrode of a reference voltage source 31. The other end of the resistor R26 is connected to an input of a buffer BF2, and the other electrode of the capacitor C3 is connected to the ground. The reference voltage source 31 generates a reference voltage VREF1 from its positive electrode, and its negative electrode is connected to the ground.

An inversion input of an operational amplifier OP2 receives an output of the buffer BF1 via a resistor R22, and a non-inversion input of the operational amplifier OP2 receives an output of the buffer BF2 via a resistor R23 and is connected to the positive electrode of the reference voltage source 31 via a resistor R27. The buffers BF1 and BF2 are disposed at the inversion input and non-inversion input of the operational amplifier OP2, respectively, in consideration of the fact that the input impedance of the operational amplifier OP2 is not high from a viewpoint of the configuration of the circuit.

An output of the operational amplifier OP2 is connected to an output terminal P2 and is fed back to the inversion input via a resistor RFB. The differential amplifier part is constructed by the ac signal source SIG1, capacitors C2 and C3, resistors R22 to R27 and RFB, reference voltage source 31, operational amplifier OP2, and buffers BF1 and BF2.

An LPF (Low Pass Filter) is constructed by the capacitor C3 and a balance resistor R24 in an input buffer unit 6. An HPF (High Pass Filter) is constructed by the capacitor C2 and a synthetic resistor of the balance resistor R24 and a resistor R25. By the combination of the LPF and the HPF, a kind of BPF (band pass filter) is obtained. The resistor R26 is provided to compensate an error corresponding to an amount of a bias current in the input part of the buffer BF1 caused by the resistor R25. The resistor R26 is set to have the same resistance value as that of the resistor R25.

The resistors R24, R25, and R26 in the input buffer unit 6 are set to, for example, 5 KΩ, 800 KΩ, and 800 KΩ, respectively. The capacitor C2 is set to 1 $\mu$F and the capacitor C3 is set to 5 pF.

A quick charging/discharging circuit 5 is connected to the terminal P1. The quick charging/discharging circuit 5 has an operational amplifier OP1, an NPN bipolar transistor Q5, a capacitor C11, and resistors R11 and RPD. The capacitor C11 and the resistors R11 and RPD are connected in series between a power source voltage Vcc and a ground level. The base of the NPN bipolar transistor Q5 is connected to a node N11 which is positioned between the resistors R11 and RPD.

The terminal P1 is connected to the inversion input of the operational amplifier OP1. The positive electrode of a reference voltage source 32 is connected to the non-inversion input of the operational amplifier OP1. An output of the operational amplifier OP1 is connected to the terminal P1 and is fed back to the non-inversion input. The reference voltage source 32 generates a reference voltage VREF2 from its positive electrode, and its negative electrode is connected to the ground. The reference voltage VREF2 of the reference voltage source 32 is a voltage desired to quickly rise immediately after turn-on of power. The reference voltage VREF2 is set to, for example, the same voltage as the reference voltage VREF1.

As each of the reference voltage sources 31 and 32, for example, a band gap circuit for generating the reference voltage VREF1 or VREF2 on the basis of the power source voltage Vcc is used. The band gap circuit can generate the reference voltage VREF1 or VREF2 which can rise to a stable voltage almost equal to the power source voltage Vcc.

The emitter of the NPN bipolar transistor Q5 is connected to the ground, and the collector is connected to the operational amplifier OP1. Consequently, the NPN bipolar transistor Q5 functions as a drive current source of the operational amplifier OP1. When the NPN bipolar transistor Q5 is in an ON state, the operational amplifier OP1 is in an enable (operable) state. When the NPN bipolar transistor Q5 is in an OFF state, the operational amplifier OP1 is in a disable (inoperative) state.

The differential amplification circuit having such a configuration executes a differential amplification operation by the operational amplifier OP2 on the basis of an ac signal obtained from the ac signal source SIG1. In the operation, the ac signal is supplied via the capacitor C2 to the terminal P1. When the capacitance value of the capacitor C2 and the resistance value of the resistor R25 are large, however, it takes time for the potential of the terminal P1 to follow the potential of the terminal P0. It is therefore difficult to normally perform the differential amplifying operation from immediately after turn-on of power because a current for charging/discharging the capacitor C2 passes through the resistor R25.

The quick charging/discharging circuit 5 is added to solve the problem and is designed so that the potential of the terminal P1 exceeds a potential VBE (0.6 to 0.7V) between the base and emitter of the NPN bipolar transistor Q5 at the node N11 only for a predetermined period immediately after turn-on of power by the capacitor C11 and the resistors R11 and RPD.

The NPN bipolar transistor Q5 therefore enters an ON state for a predetermined period immediately after turn-on of power to thereby make the operational amplifier OP1 enter an enable state. By the output of the operational amplifier OP1, the terminal P1 is rapidly charged or discharged to the reference voltage VREF2.

After that, when the NPN bipolar transistor Q5 enters an OFF state, the operational amplifier OP1 enters a disenable state and the output of the operational amplifier OP1 becomes a high impedance. The quick charging/discharging operation by the quick charging/discharging circuit 5 is finished.

As described above, the quick charging/discharging circuit 5 executes the charging/discharging operation to make the terminal P1 rapidly have the reference voltage VREF2 in the predetermined period immediately after turn-on of power. Consequently, the differential amplification circuit can normally perform the differential amplification operation from immediately after turn-on of power.

The conventional differential amplification circuit having the quick charging/discharging circuit is constructed as described above. The quick charging/discharging circuit is constructed by using the operational amplifier. The operational amplifier has to have therein a capacitor for phase compensation and the like, so that it is a circuit device unsuitable for reduction in chip size. It causes a problem such that the operational amplifier deteriorates the high degree of integration of the differential amplification circuit.

SUMMARY OF THE INVENTION

According to a first aspect of the invention, a semiconductor integrated circuit comprises: a signal processing unit having a terminal with potential set on the basis of an input signal, performing a predetermined signal process on the basis of the potential of the terminal; and a potential setting circuit connected to the terminal, for diving the terminal toward a predetermined potential in a predetermined period immediately after turn-on of power. The potential setting circuit includes: a first bipolar transistor having an emitter connected to the terminal and a collector receiving the predetermined potential; a second bipolar transistor having a collector connected to the terminal and an emitter receiving the predetermined potential; and base potential supplying means for supplying a base potential making the first and second bipolar transistors operative in the predetermined period immediately after turn-on of power to the first and second bipolar transistors.

According to a second aspect of the invention, in the semiconductor integrated circuit, the first and second bipolar transistors may receive the base potential via first and second resistors, respectively.

According to a third aspect of the invention, in the semiconductor integrated circuit, the signal processing unit includes a differential amplifier unit using an operational amplifier having first and second inputs serving as a differential pair. The differential amplifier unit further includes a dummy resistor whose one end is connected to at least one of the first and second inputs and whose other end is in a floating state. A resistance value of the dummy resistor is set so that resistance values of resistors attached to the first and second inputs of the operational amplifier are about the same.

In the semiconductor integrated circuit of the first aspect of the invention, by turning on one of the first and second bipolar transistors in a normal state and turning on the other one in an opposite state (the emitter and the collector are used opposite to each other) in accordance with the result of the comparison between the predetermined potential and the potential of the terminal in the predetermined period immediately after turn-on of power, the potential of the terminal can be set toward the predetermined potential.

The main components of the potential setting circuit are the first and second bipolar transistors. The circuit can be therefore realized with a relatively simple circuit configuration, the chip size of the semiconductor integrated circuit can be reduced, and the degree of integration can be improved.

Since the first and second bipolar transistors can be made operative when the potential difference between the potential of the terminal and the predetermined potential is equal to or larger than the collector saturation voltage, the potential of the terminal can be set to a value very close to the predetermined potential more rapidly.

In the semiconductor integrated circuit of the second aspect of the invention, the first and second bipolar transistors receive a base potential via the first and second resistors, respectively. By the voltage drop which occurs when the base current flows through the first and second resistors, a larger base potential as compared with that in the case where the first and second resistors do not exist is supplied to the bipolar transistor which is turned on in a normal state.

By supplying a larger amount of the base current to the bipolar transistor which is turned on in the normal state and has the current amplification factor greater than that of the bipolar transistor which is turned on in the opposite state, the base current can be effectively used.

In addition, by supplying a smaller amount of the base current to the bipolar transistor which is turned on in the opposite state, the operation of the parasitic bipolar transistor accompanying the bipolar transistor which is turned on in the opposite state can be effectively suppressed.

In the semiconductor integrated circuit of the third aspect of the invention, due to the existence of the dummy resistor, when a leak current flows to the resistors provided for the first and second inputs of the operational amplifier, leak currents which are almost the same are generated at the first and second inputs. Consequently, an adverse influence is not exerted on the differential input of the first and second inputs of the operational amplifier, and the operating characteristics of the differential amplification unit do not deteriorate by the leak current.

An object of the present invention is to obtain a semiconductor integrated circuit which can operate normally from immediately after turn-on of power without deteriorating high degree of integration.

These and other objects, features, aspects, and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
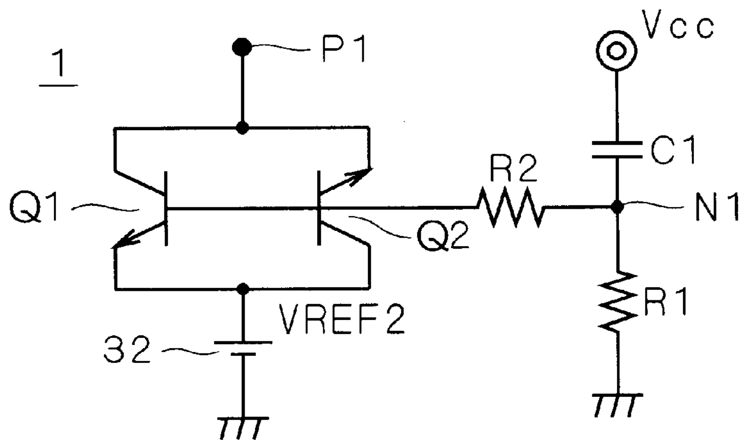
FIG. 1 is a circuit diagram showing the internal configuration of a quick charging/discharging circuit in a differential amplification circuit according to a first preferred embodiment.
Figure 7:
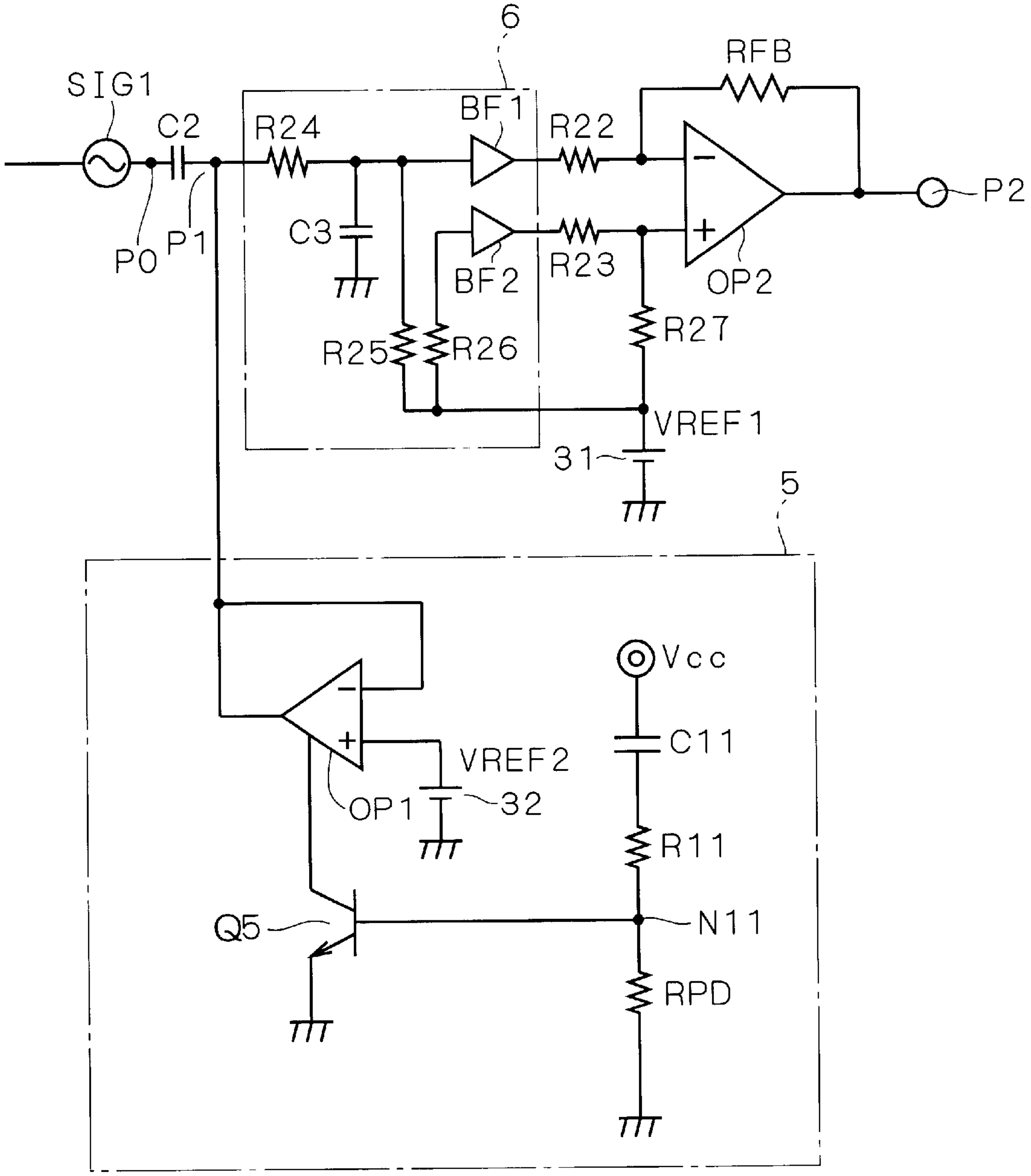
FIG. 7 is a circuit diagram showing a conventional differential amplification circuit having a quick charging/discharging circuit.

FIG. 1 is a circuit diagram showing the internal configuration of a quick charging/discharging circuit in a differential amplification circuit according to a first preferred embodiment of the invention. The configuration of a differential amplifier unit as a signal processing unit connected to the terminal P1 is similar to the conventional configuration shown in FIG. 7. The differential amplification circuit of the first preferred embodiment has therefore a configuration in which the quick charging/discharging circuit 5 as a circuit of setting the potential of the terminal P1 in the circuit configuration of FIG. 7 is replaced by a quick charging/discharging circuit 1 shown in FIG. 1.

As shown in FIG. 1, the quick charging/discharging circuit 1 of the first preferred embodiment is constructed by NPN bipolar transistors Q1 and Q2, resistors R1 and R2, a capacitor C1 and a reference voltage source 32.

The capacitor C1 and the resistor R1 are connected in series between the power source voltage Vcc and the ground level, and the node N1 positioning between the capacitor C1 and the resistor R1 is commonly connected to the bases of the NPN bipolar transistors Q1 and Q2 via the resistor R2.

The collector of the NPN bipolar transistor Q1 is connected to the terminal P1 and the emitter of the same is connected to the positive electrode of the reference voltage source 32. The emitter of the NPN bipolar transistor Q2 is connected to the terminal P1 and the collector of the same is connected to the positive electrode of the reference voltage source 32. The reference voltage source 32 generates the reference voltage VREF2 from its positive electrode, and the negative electrode is connected to the ground.

A differentiating circuit constructed by the capacitor C1 and the resistors R1 and R2 functions as base potential supplying means for supplying a base potential which makes the NPN bipolar transistors Q1 and Q2 enter an ON state in a predetermined period immediately after turn-on of power (period determined by the differentiating circuit), and supplying a base potential at the earth level after elapse of the predetermined time.

The operation of the quick charging/discharging circuit 1 in the predetermined period immediately after turn-on of power will be described hereinbelow. In the period, when the potential of the terminal P1 is higher than the reference voltage VREF2, the NPN bipolar transistor Q1 is turned on in a normal state and the NPN bipolar transistor Q2 is turned on in an opposite state.

As a result, by rapidly discharging the terminal P1 by the collector current of the NPN bipolar transistor Q1 and the emitter current of the NPN bipolar transistor Q2, the potential of the terminal P1 is driven and set toward the reference voltage VREF2. The opposite state denotes a case where the collector and the emitter function opposite to each other.

On the other hand, when the potential of the terminal P1 is lower than the reference voltage VREF2, the NPN bipolar transistor Q2 is turned on in a normal state and the NPN bipolar transistor Q1 is turned on in an opposite state. By rapidly charging the terminal P1 by the emitter current of the NPN bipolar transistor Q1 and the collector current of the NPN bipolar transistor Q2, the potential of the terminal PI is driven and set toward the reference voltage VREF2.

As described above, the quick charging/discharging circuit 1 in the first preferred embodiment performs the quick charging/discharging operation to drive and set the potential of the terminal P1 toward the reference voltage VREF2 in the predetermined period immediately after turn-on of power. It enables the differential amplification circuit to normally perform a differential amplification operation from immediately after turn-on of power.

Since the quick charging/discharging circuit 1 can be realized by a relatively simple circuit configuration such that the main portion is constructed by the NPN bipolar transistors Q1 and Q2 without using an operational amplifier, the chip size of the differential amplifying circuit can be reduced and the degree of integration can be improved.

In addition, when a potential difference equal to or larger than a collector saturation voltage (about 0.1 to 0.3V) occurs between the collector and the emitter, the NPN bipolar transistors Q1 and Q2 can maintain the ON operation. Thus, the potential of the terminal P1 can be adjusted very close to the reference voltage VREF2 in short time.

Second Preferred Embodiment

The quick charging/discharging circuit 1 of the first preferred embodiment has the following problem with respect to the NPN bipolar transistor which is turned on in the opposite state.

When the NPN bipolar transistor is turned on in the opposite state and a current flows from the emitter to the collector, a current amplification factor hFE at that time is around "1" which is much lower than that of 50 to 300 of the NPN bipolar transistor which is turned on in a normal state, so that the base current is consumed in vain. The vain consumption of the base current causes a problem of a large calculation error also in the predetermined time (time during which the NPN bipolar transistors Q1 and Q2 are made operative after immediately after turn-on of power) which is set by the differentiating circuit (the capacitor C1 and the resistors R1 and R2).

Figure 3:
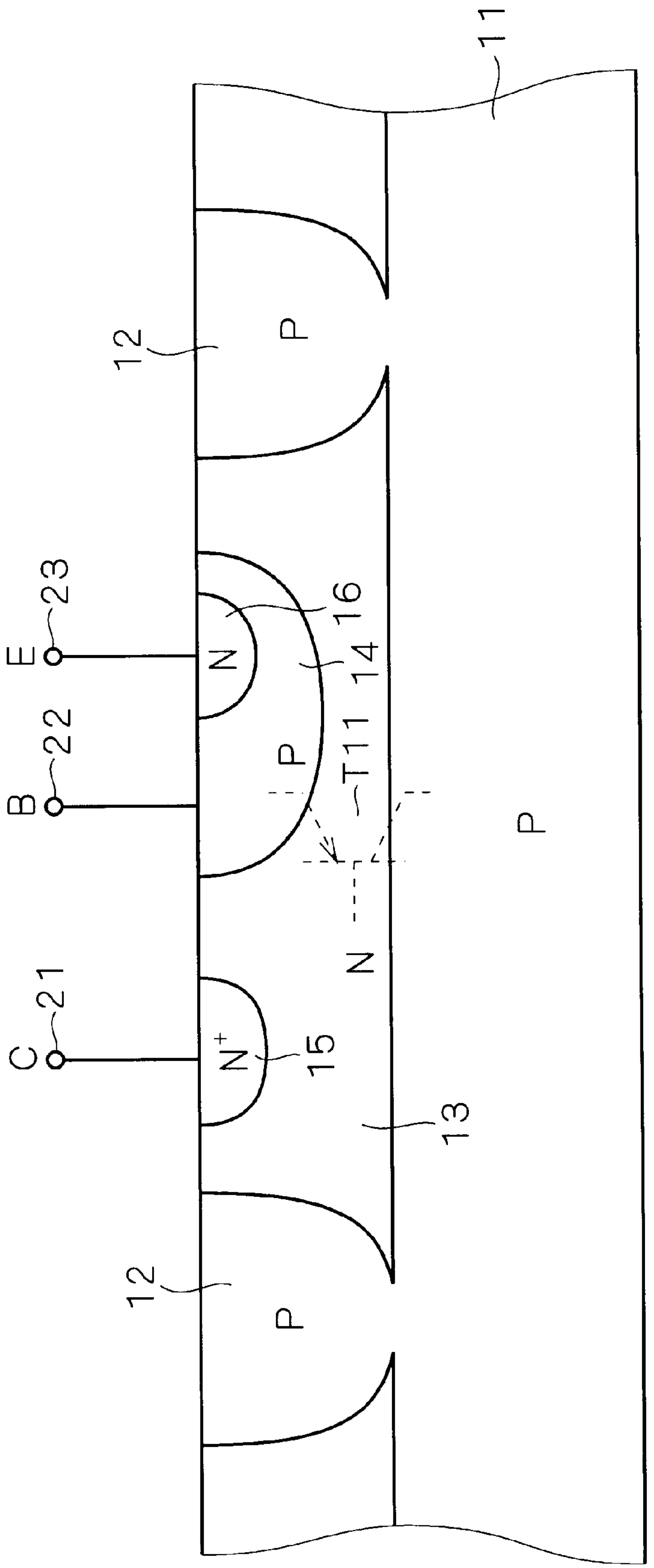
FIG. 3 is a cross section showing a general structure of an NPN bipolar transistor.

FIG. 3 is a cross section showing a general structure of the NPN bipolar transistor. As shown in FIG. 3, an N epitaxial layer 13 isolated by a P isolation layer 12 is provided on a P-type substrate 11. In the surface of the N epitaxial layer 13, a P base region 14 and an N+ collector region 15 are selectively formed. In the surface of the P base region 14, an N emitter region 16 is selectively formed. A collector terminal 21 is provided in the N+ collector region 15, a base terminal 22 is provided in the P base region 14, and an emitter terminal 23 is provided in the N emitter region 16. In the structure shown in FIG. 3, an NPN bipolar transistor is constructed by the N emitter region 16, the P base region 14, and the N+ collector region 15.

Figure 4:
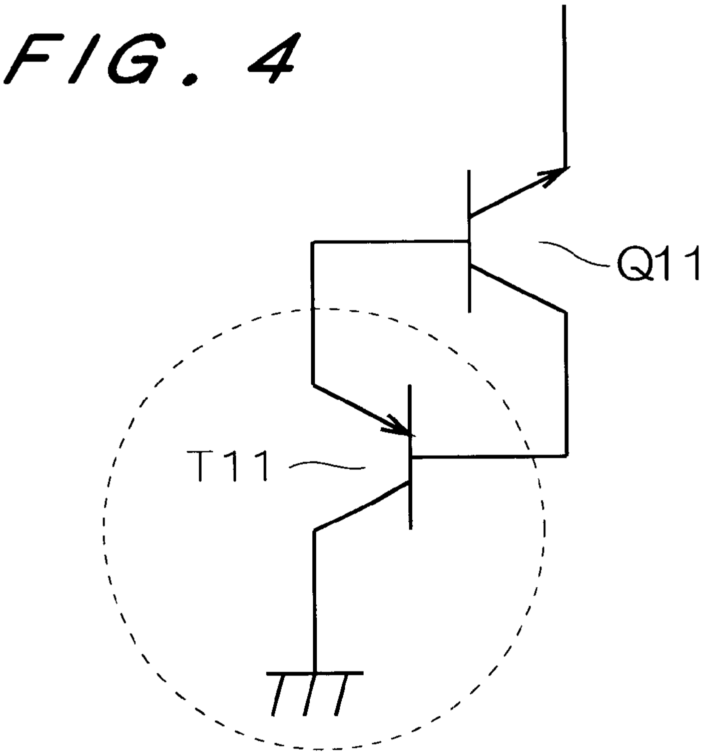
FIG. 4 is a circuit diagram showing a parasitic bipolar transistor.

The NPN bipolar transistor generally has the structure as shown in FIG. 3. When the collector potential drops below the base potential, a PNP parasitic bipolar transistor T11 constructed by the P base region 14, the N epitaxial layer 13, and the P-type substrate 11 operates. FIG. 4 is a circuit diagram showing the PNP parasitic bipolar transistor T11 which is parasitic on the inherent NPN bipolar transistor Q11. In FIG. 4, the NPN bipolar transistor Q11 denotes an NPN bipolar transistor formed by the N emitter region 16, the P base region 14, and the $N^+$ collector region 15.

When the PNP parasitic bipolar transistor T11 operates, an increase in leak current is caused. Consequently, a problem such that the effect of the NPN bipolar transistor Q11 as an analog switch deteriorates arises.

A differential amplification circuit of a second preferred embodiment has been achieved by eliminating the problem caused by the bipolar transistor which is turned on in such an opposite state.

Figure 2:
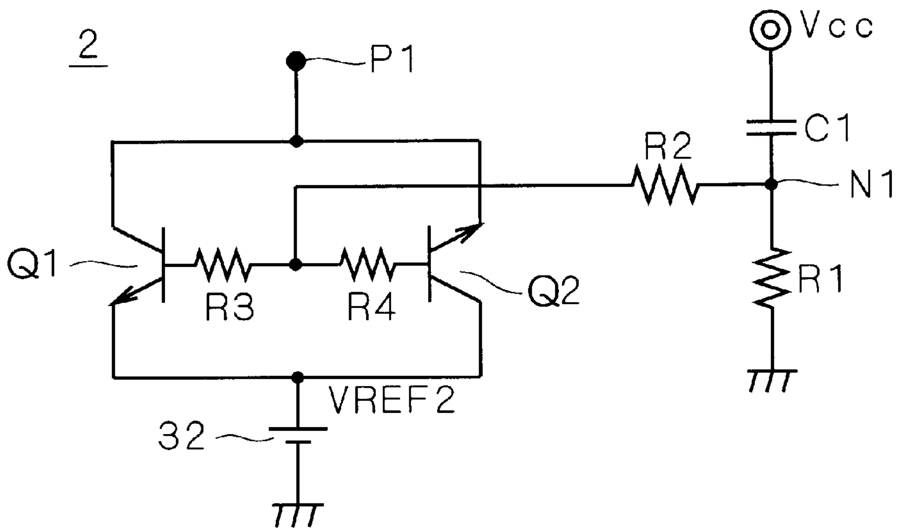
FIG. 2 is a circuit diagram showing the configuration of a quick charging/discharging circuit in a differential amplification circuit according to a second preferred embodiment.

FIG. 2 is a circuit diagram showing the configuration of a quick charging/discharging circuit in the differential amplification circuit according to the second preferred embodiment of the invention. The configuration of a differential amplifier unit connected to the terminal P1 is similar to the conventional one shown in FIG. 7. The differential amplification circuit of the second preferred embodiment has a configuration similar to that in FIG. 7 except that the quick charging/discharging circuit 5 is replaced by a quick charging/discharging circuit 2 shown in FIG. 2.

As shown in FIG. 2, the NPN bipolar transistors Q1 and Q2 in the quick charging/discharging circuit 2 are connected to one end of the resistor R2 via the balance resistors R3 and R4, respectively. Since the other configuration is similar to that of the quick charging/discharging circuit 1 of the first preferred embodiment shown in FIG. 1, its description is omitted here.

In such a configuration, in a manner similar to the quick charging/discharging circuit 1 of the first preferred embodiment, the quick charging/discharging circuit 2 of the second preferred embodiment executes an operation of rapidly charging/discharging the terminal P1 toward the reference voltage VREF2 in a predetermined period immediately after turn-on of power, so that the differential amplification circuit can normally perform a differential amplifying operation from immediately after turn-on of power, and effects similar to those of the differential amplification circuit of the first preferred embodiment are produced.

Further, the quick charging/discharging circuit 2 of the second preferred embodiment effectively suppresses the base current flowing in the NPN bipolar transistor Q1 or Q2 which is turned on in the opposite state by a voltage drop which occurs when the base current passes through the balance resistors R3 and R4, thereby enabling the problem regarding the bipolar transistor which is turned on in the opposite state to be solved.

A specific example of solving the problem will be described in detail hereinbelow. In the configuration of the first preferred embodiment shown in FIG. 1, assumption conditions are set as follows. When a common base current IB for the NPN bipolar transistors Q1 and Q2 is 10 mA and the current flows from the terminal P1 to the reference voltage source 32, the current amplification factor hFE of the NPN bipolar transistor Q1 which is turned on in the normal state is "100" and that of the NPN bipolar transistor Q2 which is turned on in the opposite state is "1".

Under the assumption conditions, 9.9 mA which is most of the common base current IB becomes the base current IB(Q2) of the NPN bipolar transistor Q2, and the base current IB(Q1) of the NPN bipolar transistor Q1 becomes 0.1 mA which is close to zero. Consequently, the current amount discharged from the terminal P1 to the reference voltage source 32 is 19.9 mA.

Assuming now that the resistance value of each of the balance resistors R3 and R4 is 20 Ω in the configuration of the second preferred embodiment, when most of the common base current IB flows through the balance resistor R4 under assumption conditions similar to those of the first preferred embodiment, the voltage decreases by about 0.2V due to a voltage drop caused by the balance resistor R4. The base potential of the NPN bipolar transistor Q1 therefore becomes high relative to that of the NPN bipolar transistor Q2. A part of the common base current IB starts to flow as the base current of the NPN bipolar transistor Q1. In relation to the base potentials of the NPN bipolar transistors Q1 and Q2, the currents IB(Q2) and IB(Q1) are balanced with predetermined current amounts.

When it is assumed that IB(Q1) of 1 mA and IB(Q2) of 9 mA are balanced, the current of 100 mA can be discharged by the NPN bipolar transistor Q1, and the current of 9 mA can be discharged by the NPN bipolar transistor Q2. Consequently, the amount of current discharged from the terminal P1 to the reference voltage source 32 becomes 109 mA. The common base current IB can be utilized more effectively by five times or more as compared with the first preferred embodiment.

By supplying a smaller base current to the bipolar transistor Q2 which is turned on in the opposite state, the operation of the parasitic bipolar transistor accompanying the bipolar transistor Q2 can be effectively suppressed. Especially, since the parasitic bipolar transistor operates more at a high temperature, in the differential amplification circuit of the second preferred embodiment, the deterioration in operating characteristics at high temperature can be suppressed.

Third Preferred Embodiment

Figure 5:
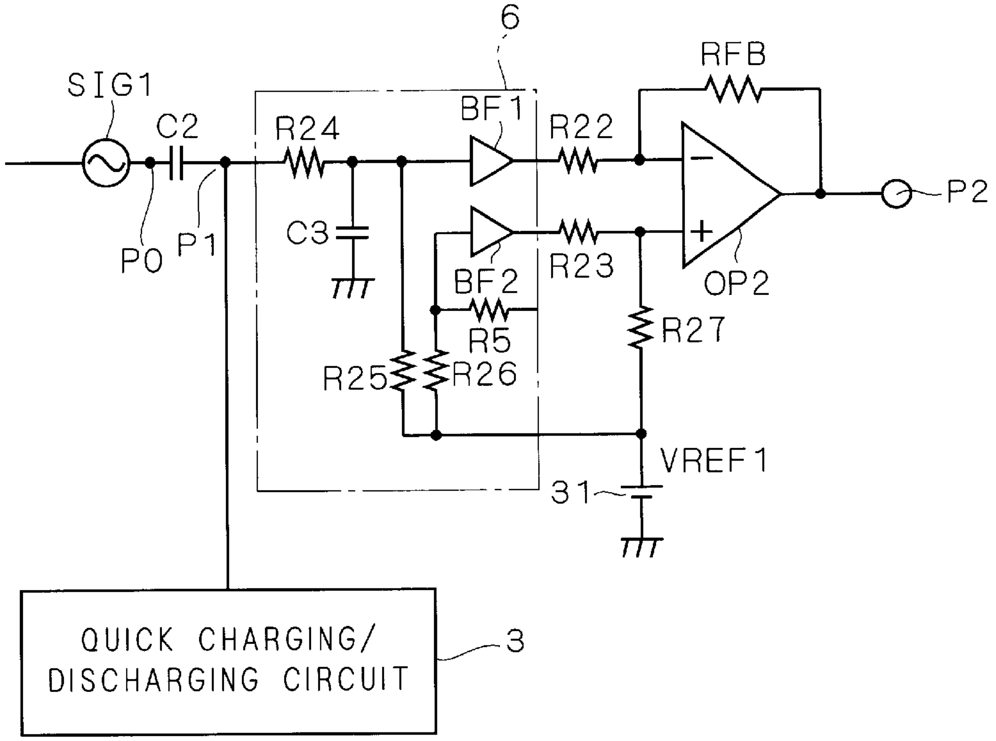
FIG. 5 is a circuit diagram showing the configuration of a differential amplification circuit according to a third preferred embodiment of the invention.

FIG. 5 is a circuit diagram showing the configuration of a differential amplification circuit as a third preferred embodiment of the invention. As a quick charging/discharging circuit 3 shown in FIG. 5, any of the quick charging/discharging circuit 1 of the first preferred embodiment, the quick charging/discharging circuit 2 of the second preferred embodiment, and the conventional quick charging/discharging circuit 5 may be used.

As shown in FIG. 5, in the input buffer unit 6 in the differential amplifier unit, one end of a dummy resistor R5 newly provided is connected to the input of the buffer BF2 and the other end of the dummy resistor R5 is floating. The dummy resistor R5 is set to have the same resistance value as that of the resistor R24 connected to the input of the buffer BF1.

Figure 6:
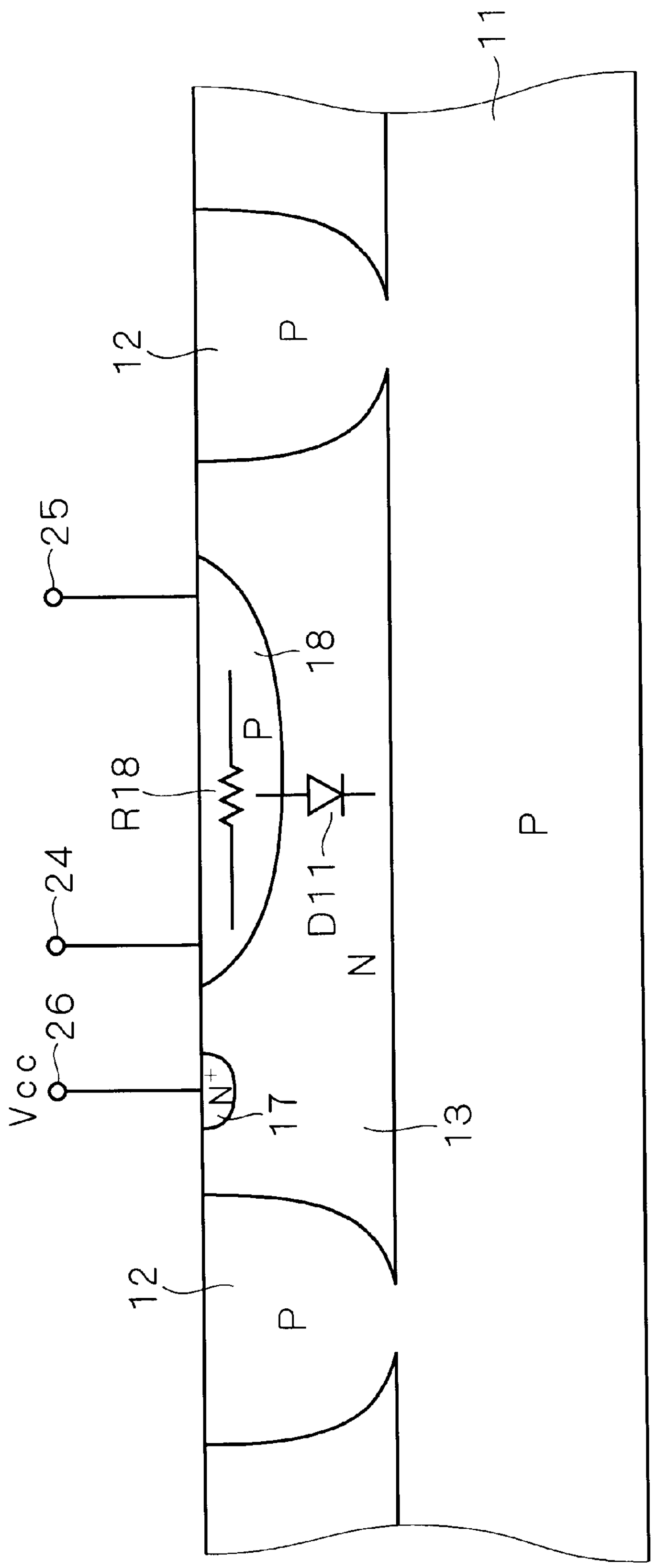
FIG. 6 is a cross section showing a general structure of a diffused resistor.

FIG. 6 is a cross section showing a general configuration of a diffused resistor used as each of the resistors R24, R25, R26 and R5. As shown in FIG. 6, the N epitaxial layer 13 isolated by the P isolation layer 12 is provided on the P-type substrate 11. In the surface of the N epitaxial layer 13, an N diffusion region 17 and a diffused resistance region 18 are selectively provided. Resistance terminals 24 and 25 are provided at both ends of the diffused resistance region 18.

A diffused resistor R18 as the diffused resistance region 18 between the resistance terminals 24 and 25 is consequently formed. The diffused resistor RI 8 is used as each of the resistors R24, R25, R26, and R5 in FIG. 5 and the like. A power source terminal 26 is provided in the N diffusion region 17, and the power source voltage Vcc for fixing the potential of the N epitaxial layer 13 is applied to the power source terminal 26.

In the case of using the diffused resistor as described above, a parasitic diode D11 is generated by the diffused resistance region 18 and the N epitaxial layer 13. Since the N epitaxial layer 13 is fixed to the power source voltage Vcc and the parasitic diode D11 is reverse biased, a leak current is not usually passed from the power source to the diffused resistor R18 via the parasitic diode D11.

At a high temperature of about one hundred and tens degrees, the leak current gradually flows. In the case where the resistance value of the resistor R25 (R26) is set to a large value to increase the time constant of the HPF, an influence of the leak current flowing via the parasitic diode D11 becomes a problem.

In the differential amplification circuit of the third preferred embodiment, the same resistance value is set in the resistors R25 and R26, and the resistance value of the newly added dummy resistor R5 is set to be equal to that of the resistor R24. Consequently, a leak current which occurs in the resistors R24 and R25 in the input portion of the buffer BF1 and a leak current which occurs in the resistors R26 and R5 in the input portion of the buffer BF2 become equal to each other.

In other words, in the differential amplification circuit of the third preferred embodiment, the leak current by the resistor R24 is compensated by the leak current of the newly provided dummy resistor R5, so that no adverse influence of the leak current exerts on the differential inputs of the inversion input and the non-inversion input serving as differential pair to the operational amplifier OP2 supplied via the buffers BF1 and BF2. As a result, an effect such that the operating characteristics at high temperature of the differential amplification circuit of the third preferred embodiment do not deteriorate is produced.

Since the other end of the dummy resistor R5 is floating, only a leak current which is almost equal to that of the resistor R24 is generated at high temperature. The other end is not involved in an ordinary operation of the differential amplification circuit.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor integrated circuit comprising:

a signal processing unit having a terminal with potential set on the basis of an input signal, for performing a predetermined signal process on the basis of the potential of said terminal; and a potential setting circuit connected to said terminal, for bi-directionally driving said terminal toward a predetermined potential in a predetermined period immediately after turn-on of power, is said potential setting circuit including:

a first bipolar transistor having an emitter connected to said terminal and a collector receiving said predetermined potential;

a second bipolar transistor having a collector connected to said terminal and an emitter receiving said predetermined potential; and base potential supplying means for supplying a base potential making said first and second bipolar transistors operative in said predetermined period immediately after turn-on of power.

2. The semiconductor integrated circuit according to claim 1, wherein said signal processing unit includes a differential amplifier unit using an operational amplifier having first and second inputs serving as a differential pair, said differential amplifier unit further includes a dummy resistor whose one end is connected to at least one of said first and second inputs and whose other end is in a floating state, and a resistance value of said dummy resistor is set so that resistance values of resistors accompanying to said first and second inputs of said operational amplifier are about the same.

3. The semiconductor integrated circuit according to claim 1, wherein said first and second bipolar transistors receive said base potential via first and second resistors, respectively.

4. The semiconductor integrated circuit according to claim 3, wherein said signal processing unit includes a differential amplifier unit using an operational amplifier having first and second inputs serving as a differential pair, said differential amplifier unit further includes a dummy resistor whose one end is connected to at least one of said first and second inputs and whose other end is in a floating state, and a resistance value of said dummy resistor is set so that resistance values of resistors attached to said first and second inputs of said operational amplifier are about the same.

5. A semiconductor integrated circuit comprising:

a signal processing unit having a terminal with potential set on the basis of an input signal, for performing a predetermined signal process on the basis of the potential of said terminal; and a potential setting circuit connected to said terminal, for driving said terminal toward a predetermined potential in a predetermined period immediately after turn-on of power, said potential setting circuit including:

a first bipolar transistor having an emitter connected to said terminal and a collector receiving said predetermined potential;

a second bipolar transistor having a collector connected to said terminal and an emitter receiving said predetermined potential;

base potential supplying means for supplying a base potential making said first and second bipolar transistors operative in said predetermined period immediately after turn-on of power; and wherein bases of said first bipolar transistor and said second bipolar transistor are directly connected to said base potential.

6. The semiconductor integrated circuit according to claim 5, wherein said signal processing unit includes a differential amplifier unit using an operational amplifier having first and second inputs serving as a differential pair, said differential amplifier unit further includes a dummy resistor whose one end is connected to at least one of said first and second inputs and whose other end is in a floating state, and a resistance value of said dummy resistor is set so that resistance values of resistors accompanying to said first and second inputs of said operational amplifier are about the same.

7. A semiconductor integrated circuit comprising:

a signal processing unit having a terminal with potential set on the basis of an input signal, for performing a predetermined signal process on the basis of the potential of said terminal; and a potential setting circuit connected to said terminal, for driving said terminal toward a predetermined potential in a predetermined period immediately after turn-on of power, said potential setting circuit including:

a first bipolar transistor having an emitter connected to said terminal and a collector receiving said predetermined potential;

second bipolar transistor having a collector connected to said terminal and an emitter receiving said predetermined potential;

base potential supplying means for supplying a base potential making said first and second bipolar transistors operative in said predetermined period immediately after turn-on of power; and wherein a collector of said first bipolar transistor and an emitter of said second bipolar transistor are directly connected; and an emitter or of said first bipolar transistor and the collector of said second bipolar transistor are directly connected.

8. The semiconductor integrated circuit according to claim 7, wherein said signal processing unit includes a differential amplifier unit using an operational amplifier having first and second inputs serving as a differential pair, said differential amplifier unit further includes a dummy resistor whose one end is connected to at least one of said first and second inputs and whose other end is in a floating state, and a resistance value of said dummy resistor is set so that resistance values of resistors accompanying to said first and second inputs of said operational amplifier are about the same.

9. The semiconductor integrated circuit according to claim 5, wherein said first and second bipolar transistors receive said base potential via first and second resistors, respectively.

10. The semiconductor integrated circuit according to claim 9, wherein said signal processing unit includes a differential amplifier unit using an operational amplifier having first and second inputs serving as a differential pair, said differential amplifier unit further includes a dummy resistor whose one end is connected to at least one of said first and second inputs and whose other end is in a floating state, and a resistance value of said dummy resistor is set so that resistance values of resistors attached to said first and second inputs of said operational amplifier are about the same.

* * * * *